(12) United States Patent
Schuette et al.

(10) Patent No.: US 8,887,027 B2
(45) Date of Patent: Nov. 11, 2014

(54) SOLID-STATE MASS STORAGE DEVICE AND METHOD FOR FAILURE ANTICIPATION

(71) Applicant: OCZ Technology Group, Inc., San Jose, CA (US)

(72) Inventors: Franz Michael Schuette, Colorado Springs, CO (US); Lutz Filor, San Jose, CA (US)

(73) Assignee: OCZ Storage Solutions, Inc., San Jose, CA (US)

( * ) Notice: Subject to any disclaimer, the term of this patent is extended or adjusted under 35 U.S.C. 154(b) by 0 days.

(21) Appl. No.: 13/901,827

(22) Filed: May 24, 2013

(65) Prior Publication Data

US 2013/0262960 A1    Oct. 3, 2013

Related U.S. Application Data

(62) Division of application No. 12/986,564, filed on Jan. 7, 2011, now Pat. No. 8,489,966.

(60) Provisional application No. 61/293,257, filed on Jan. 8, 2010.

(51) Int. Cl.
 *G11C 29/00* (2006.01)

(52) U.S. Cl.
 USPC .......................................................... 714/773

(58) Field of Classification Search
 USPC .......................................................... 714/774
 See application file for complete search history.

(56) References Cited

U.S. PATENT DOCUMENTS

| 6,230,233 | B1 * | 5/2001 | Lofgren et al. | 711/103 |
| 7,139,863 | B1 * | 11/2006 | Defouw et al. | 711/103 |
| 7,523,013 | B2 * | 4/2009 | Gorobets et al. | 702/177 |
| 2010/0287328 | A1 * | 11/2010 | Feldman et al. | 711/103 |
| 2010/0306577 | A1 * | 12/2010 | Dreifus et al. | 714/6 |
| 2010/0306580 | A1 * | 12/2010 | McKean et al. | 714/8 |

\* cited by examiner

*Primary Examiner* — Joseph D Torres
(74) *Attorney, Agent, or Firm* — Hartman Global IP Law; Gary M. Hartman; Domenica N. S. Hartman

(57) ABSTRACT

A solid-state mass storage device and method of operating the storage device to anticipate the failure of at least one memory device thereof before a write endurance limitation is reached. The method includes assigning at least a first memory block of the memory device as a wear indicator that is excluded from use as data storage, using pages of at least a set of memory blocks of the memory device for data storage, writing data to and erasing data from each memory block of the set in program/erase (P/E) cycles, performing wear leveling on the set of memory blocks, subjecting the wear indicator to more P/E cycles than the set of memory blocks, performing integrity checks of the wear indicator and monitoring its bit error rate, and taking corrective action if the bit error rate increases.

7 Claims, 3 Drawing Sheets

SOLID-STATE MASS STORAGE DEVICE AND METHOD FOR FAILURE ANTICIPATION

CROSS REFERENCE TO RELATED APPLICATIONS

This is a division patent application of co-pending U.S. patent application Ser. No. 12/986,564, filed Jan. 7, 2011, which claims the benefit of U.S. Provisional Application No. 61/293,257, filed Jan. 8, 2010, the contents of which are incorporated herein by reference.

BACKGROUND OF THE INVENTION

The present invention generally relates to memory devices for use with computers and other processing apparatuses. More particularly, this invention relates to nonvolatile-based (permanent memory-based) mass storage devices that use flash memory devices or any similar nonvolatile memory devices for permanent storage of data. The mass storage devices are characterized by allocating memory blocks for use to anticipate device failure before a critical threshold of endurance limitation is reached.

Mass storage devices such as advanced technology (ATA), small computer system interface (SCSI) drives, and USB 2.0, USB 3.0 or Gigabit Ethernet-based solid-state drives (SSD) are rapidly adopting nonvolatile memory technology such as flash memory or other emerging solid-state memory technology, including phase change memory (PCM), resistive random access memory (RRAM), magnetoresistive random access memory (MRAM), ferromagnetic random access memory (FRAM), organic memories, and nanotechnology-based storage media such as carbon nanofiber/nanotube-based substrates. Currently the most common technology uses NAND flash memory as inexpensive storage memory.

Endurance and data retention limitations that are inherent to the design and function of NAND flash technology are becoming increasingly more problematic for use of this technology in solid-state drives. Briefly, flash memory components store information in an array of floating-gate transistors, referred to as cells. NAND flash cells are organized in what are commonly referred to as pages, which in turn are organized in predetermined sections of the component referred to as memory blocks (or sectors). Each cell of a NAND flash memory component has a top gate (TG) and a floating gate (FG), the latter being sandwiched between the top gate and the channel of the cell. The floating gate is separated from the channel by a layer of tunnel oxide. Data are stored in a NAND flash cell in the form of a charge on the floating gate which, in turn, defines the channel properties of the NAND flash cell by either augmenting or opposing the charge of the top gate. This charge on the floating gate is achieved by applying a programming voltage to the top gate. The process of programming (writing 0's to) a NAND cell requires injection of electrons into the floating gate by quantum mechanical tunneling, whereas the process of erasing (writing 1's to) a NAND cell requires applying an erase voltage to the device substrate, which then pulls electrons from the floating gate. Programming and erasing NAND flash cells is an extremely harsh process utilizing electrical fields in excess of 10 million V/cm to move electrons through the tunnel oxide layer.

The brute force approach used to program and erase NAND flash results in wear and fatigue of the cells by causing atomic bond sites in the tunnel oxide layer to break. The broken-bond sites then become a trap for electrons that mimic charges in the floating gate, which can cause false data to be read from the NAND flash cells or prevent correct erasing of the cells. In the case of single level cells, where only one bit is stored per cell, the trapping of electrons is a relatively minor issue that gradually increases to a critical threshold over tens of thousands of program and erase (P/E) cycles. However, in the case of multilevel cells (MLC) that use, for example, four different levels to encode two bits per cell, the "drift" in charge caused by a steady build-up of electrons in the tunnel oxide layer and at the borders between the layers constitutes the predominant limitation of write endurance (which as used herein refers to the number of P/E cycles beyond which a solid-state memory device may become unreliable). Using 50 nm process technology as an example, MLC NAND flash memory is expected to sustain approximately 10,000 P/E cycles per cell before reaching the endurance limitation caused by degradation of the tunnel oxide layer. Data retention dramatically declines with every reduction in process geometry because of proximity effects, in particular, stress-induced leakage current (SILC), which refers to the release of electrons from the floating gate caused by erasure of a nearby block. For example, for a 3× nm process, typical write endurance is on the order of about 3000 to 5000 P/E cycles per cell, and for a 22 nm process write endurance estimates decrease toward about 900 to about 1200 P/E cycles per cell.

The life cycle of any solid-state drive is determined by its weakest component. Once individual blocks start to develop unrecoverable bit error rates (UBER) leading to data loss, the entire SSD has reached its end of life. In this context, one must consider that NAND flash is a form of memory and favors similar grouping of coherent data, known in DRAM and SRAM technology as locality of data. Consequently, in the absence of any additional management, flash memory would develop a few "high traffic" islands while the rest of the array would be underutilized. Both functional scenarios are far from optimal since high traffic areas are exposed to excessive wear and will, therefore, reach their endurance limitation ahead of the rest of the drive, whereas some very low traffic areas will never see a data update and, therefore, develop leakage current-based data retention loss.

In order to avoid the locality effect and resulting excessive wear of a small number of flash blocks, a technology called wear leveling has been implemented. Early generations of NAND flash-based solid-state drives used relatively primitive and unsophisticated mechanisms of wear-leveling based on regional schemes. As a result, a spread of usage of up to 20× between low usage and high usage blocks was common. Modern controllers use more sophisticated wear-leveling algorithms, with the result that differences between highest and lowest usage of blocks are often less than 0.5%. This number is expected to further decline with future generations of SSD controllers.

Modern SSDs also use a technique called "Over-Provisioning" (OP), in which the accessible amount of memory allowed by the controller is less than the physical amount of flash memory present in the array. For example, an SSD with 64 GB of physical memory can be over-provisioned to only allow 80% of its memory space to be used by the system and therefore appear as a 51 GB SSD. The over-provisioned 13 GB of memory is treated as reserve and will not be used for data storage. However, the blocks can be used for temporary storage and shuffled in and out of the OP pool on demand, as long as they are replaced immediately by empty blocks.

Another media management technique is bad-block management. Unlike the case of SDRAM, flash memory is not a "perfect" storage media but has bad blocks in every chip. Bad blocks are typically recognized by error checking and correction (ECC) mechanisms and flagged to be excluded from use for data storage. Another mechanism for integrity check is signature comparison. Bad-block management can also include blocks that are spontaneously failing as a function of wear.

One of the biggest challenges with SSDs is the prediction of device failure. In conventional hard disc drives, failure rates are additive, that is, there is a linear relation between number of program and erase accesses and the number of failures. As drives age, failures and bad blocks will increase accordingly. In the case of SSDs, the situation is different in that SSDs will function without failures up to a certain threshold followed by an exponential increase of failures over a relatively small increase in usage load. However, environmental factors, including usage patterns and temperature variations, also change the behavior of SSDs. Because of changes in chip design and even minor variability in quality, as well as the mentioned environmental factors contributing to the aging process of NAND flash, it is extremely difficult to predict the onset of the exponential increase in UBER and, by extension, predict the sudden death of an SSD.

BRIEF DESCRIPTION OF THE INVENTION

The present invention provides a solid-state mass storage device for use with computers and other processing apparatuses, and a method of operating the device to anticipate the failure of one or more memory devices of the mass storage device before a write endurance limitation is reached for the memory device.

According to a first aspect of the invention, the mass storage device has a controller and at least one nonvolatile memory device comprising pages that are organized into memory blocks, and the method includes using the pages of at least a set of the memory blocks of the nonvolatile memory device for data storage whereby data are written to and erased from each memory block of the set of memory blocks in program/erase (P/E) cycles, collecting information regarding the number of P/E cycles encountered by the memory blocks of the set of memory blocks and accessing the information to perform wear leveling on the set of memory blocks, assigning at least a first of the memory blocks as wear indicator means and excluding the wear indicator means from use as data storage for the nonvolatile memory device, subjecting the wear indicator means to P/E cycles so that the wear indicator means is subjected to a number of P/E cycles that is greater than the number of P/E cycles encountered by the memory blocks of the set of memory blocks, performing integrity checks of the wear indicator means and monitoring a bit error rate thereof, and taking corrective action if the bit error rate of the wear indicator means increases.

According to a second aspect of the invention, the mass storage device includes a controller, and at least one nonvolatile memory device comprising pages that are organized into memory blocks. At least a first memory block of the memory blocks is assigned as wear indicator means that is excluded from use as data storage for the nonvolatile memory device, and a plurality of the memory blocks are used as data blocks for data storage whereby data are written to and erased from each of the data blocks in program/erase (P/E) cycles. The memory device further includes means for performing wear leveling to maintain substantially the same level of usage across the data blocks, means for subjecting the wear indicator means to P/E cycles so that the wear indicator means is subjected to a number of P/E cycles that is greater than the number of P/E cycles encountered by the data blocks, and means for performing integrity checks of the wear indicator means and monitoring a bit error rate thereof.

A technical effect of the invention is the ability to more accurately predict the fatigue threshold of a solid-state drive (SSD) by assigning (flagging) specific pages and/or blocks of its memory devices as wear indicators, and then subjecting these wear indicators to a higher rate of P/E cycles than blocks used to conventionally store data on the memory devices. By subjecting the wear indicators to a higher wear rate in this manner, an earlier onset of unrecoverable bit error rates (UBER) will likely occur in the wear indicators than in the data blocks. In this manner, the invention is able to provide a wear indicator-based test-ahead feature that is capable of reliably anticipating device failure, and the capability of doing so independent of variations in design and environmental parameters.

Other aspects and advantages of this invention will be better appreciated from the following detailed description.

DETAILED DESCRIPTION OF THE INVENTION

Figure 1:
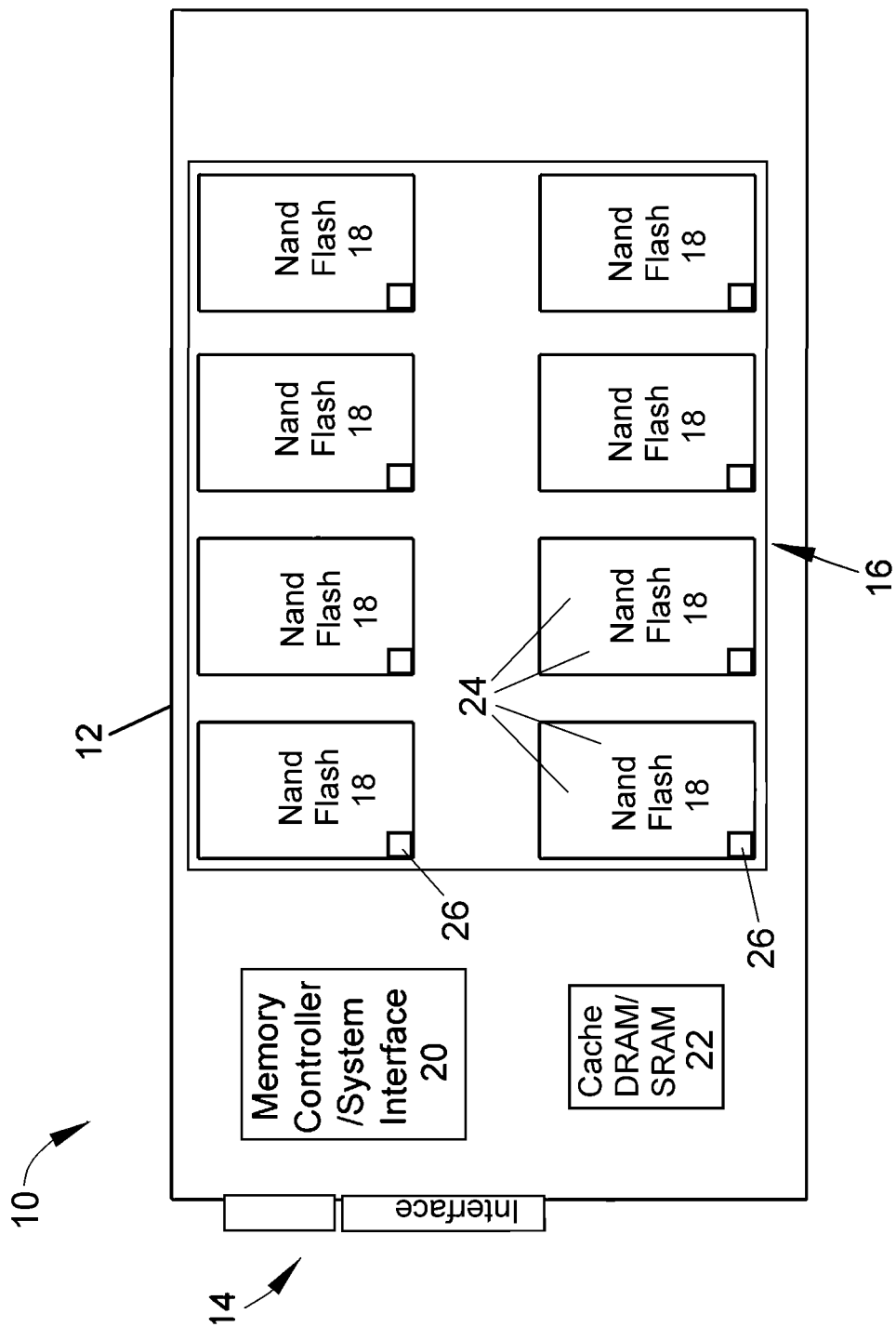
FIG. 1 is a schematic representation of a flash memory-based mass storage device (solid-state drive) with a plurality of NAND flash memory devices, each containing a wear-indicator block for assessing the state of wear of the memory devices in accordance with a preferred aspect of the invention.

The present invention is generally applicable to computers and other processing apparatuses, and particularly to computers and apparatuses that utilize nonvolatile (permanent) memory-based mass storage devices, a notable example of which are solid-state drives (SSDs) that make use of NAND flash memory devices. FIG. 1 is schematically representative of such a SSD 10, though it should be understood that mass storage devices utilizing nonvolatile memory devices and having other than the classic "drive" form factor are also within the scope of this invention. The SSD 10 is represented as being configured as an internal mass storage device for a computer or other host system (not shown) equipped with a data and control bus for interfacing with the SSD 10. The bus may operate with any suitable protocol in the art, preferred examples being the advanced technology attachment (ATA) bus in its parallel or serial iterations, fiber channel (FC), small computer system interface (SCSI), and serially attached SCSI (SAS), as well as direct PCI (peripheral component interconnect) and PCIe (PCI Express) access.

As known in the art, the SSD 10 is adapted to be accessed by the host system with which it is interfaced. In FIG. 1, this interface is through a connector (host) interface 14 carried on a drive package that includes a printed circuit board 12. Access is initiated by the host system for the purpose of storing (writing) data to (programming) and retrieving (reading) data from an array 16 of solid-state nonvolatile memory devices 18, each being an integrated circuit (IC) chip carried on the circuit board 12. According to a preferred aspect of the invention represented in FIG. 1, the memory devices 18 are NAND flash memory devices 18 that allow data to be stored, retrieved and erased on a block-by-block basis. FIG. 1 schematically represents memory blocks 24 as located within multiple predetermined sections of each memory device 18. The memory devices 18 are preferably accessed in parallel by a memory controller/system interface (controller) 20, through which data pass when being written to and read from the memory devices 18. The controller 20 may comprise, for example, a host bus interface decoder and a memory controller capable of addressing the array 16 of memory devices 18. Protocol signals received through the interface 14 are translated by an abstraction layer of the controller 20 from logical to physical addresses on the memory devices 18 to which the data are written or from which they are read. The controller 20 also addresses a volatile memory cache chip 22 integrated on the SSD 10. The cache chip 22 may be, for example, DRAM or SRAM-based, as known in the art. Alternatively, the cache memory of the SSD 10 may be integrated on the controller 20, as also known in the art.

By using a relatively sophisticated wear-leveling technique of a type currently available, the controller 20 of the SSD 10 is able to monitor the number of accesses to any given block 24 in each memory device 18 of the memory array 16, store the data in a dedicated "house-keeping" portion of each memory device 18, and then select blocks 24 with fewer reprogram/erase cycles for the next storage of data. The effect is that the access traffic to the memory array 16 can be evenly distributed over all blocks 24 by using an erase counter to monitor the erase cycles that precede any rewriting of data. The controller 20 is aware of how many times each block 24 has been programmed and erased (P/E cycles), and uses the blocks 24 with the least number of P/E cycles for the next data write cycle. Consequently, all blocks 24 within each NAND flash memory device 18, and by extension, the entire SSD 10, are subjected to the same number of P/E cycles, with only minor disparities in the overall number of P/E cycles. Moreover, such disparities are largely caused by the utilization patterns of the parallel channels interfacing with the memory array 16, and are transient, meaning that any given workload is usually optimized for performance and, as long as this workload is executed, it will result in temporary "over-usage" of specific localities within the array 16. However, this temporary effect is typically counteracted with the next set of transfers as a function of wear leveling.

Because of the effects of wear leveling, it is fair to assume that any block 24 within the array 16 is largely representative of the overall state of endurance or fatigue of any other block 24 within the array 16, which includes blocks within pools of over-provisioned (OP) blocks (not identified in FIG. 1) of the memory devices 18. The latter, after all, will be subjected to the same usage patterns as any other block 24 of a memory device 18, with the main differentiating factor that there will always have to be a reserve. Even with only marginal over-provisioning, the SSD 10 will have blocks 24 to spare at any time. At the same time, over-provisioning does not identify individual blocks 24, but rather the blocks 24 employed as OP blocks are shuffled in and out of circulation, which makes it difficult to designate the OP pool as an indicator of memory device failure (breakdown).

The situation is somewhat different in the case of a bad-block management technique implemented on the SSD 10. Bad-block management allows the identification of blocks 24 that develop one problem or another, which can encompass extended programming or erase times, or an increase in the number of errors that have to be corrected by ECC implementation. According to a preferred aspect of the invention, the ability to identify and flag individual blocks can be used as the basis for setting aside blocks that do not contain user or system data, but rather are subjected to simulated data that only serve the purpose of testing the blocks, which in turn can be used to assess the integrity and functionality of other blocks 24 of the memory devices 18 (hereinafter, "data blocks" 24), which can be used in a conventional manner to store data on the device 18. Such test blocks, referred to below as wear-indicator blocks 26, are schematically represented in FIG. 1 as being present in each memory device 18 of the array 16. Specifically, using similar techniques known in the art for flagging blocks within a memory device as bad blocks, blocks within any of the memory devices 18 can be flagged (assigned) as wear-indicator blocks 26 and excluded from use as data blocks by the memory devices 18. As is conventional, for purposes of carrying out wear-leveling on the memory devices 18, the data blocks 24 contain information regarding the number of P/E cycles encountered during their normal usage. The wear-indicator blocks 26 are then accessed by a "test-ahead" procedure performed by the controller 20, which can be based on the average workload (number of P/E cycles) of the SSD 10, to test the integrity and functionality of the wear-indicator blocks 26 and, if performed properly, assess the integrity and functionality of the data blocks 24.

As indicated in FIG. 1, the wear-indicator blocks 26 are part of the same array 16 of memory devices 18 as the data blocks 24 of those devices 18, and therefore are subjected to the same environmental parameters, such as temperature and usage frequency, that are important contributing factors for retention and write endurance of NAND flash memory devices. Therefore, independent of external parameters, the wear-indicator blocks 26 are expected to be a reliable indicator for looming failure of the memory devices 18 on the SSD 10, and can be used to initiate warning messages, data backup procedures, or any other appropriate action that may be taken with respect to the SSD 10.

Figure 2:
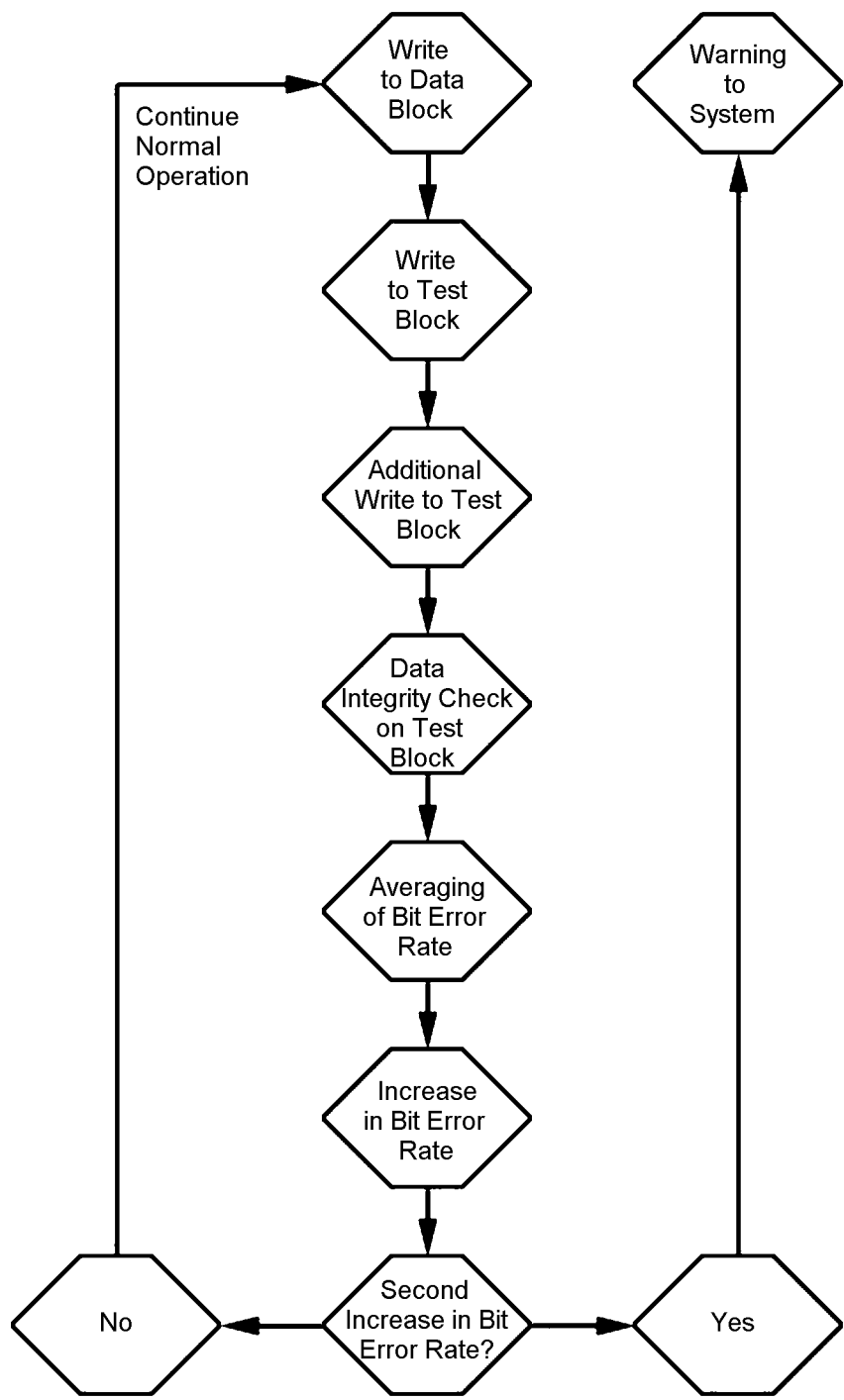
FIG. 2 is a simplified flow chart representing a method of performing failure anticipation using averaging of bit error rates on consecutive accesses of test blocks according to an embodiment of the invention.

FIG. 2 is a simplified flow chart representing a "test-ahead" procedure that uses averaging of bit error rates on consecutive accesses of wear-indicator blocks 26 (referred to as "test blocks" in FIG. 2). The wear-indicator blocks 26 are subjected to program (write), read and erase accesses (P/E cycles) performed by the controller 20 (with or without the assistance of software running in the background, for example, on the system level or through the controller's firmware) according to the information in the wear-leveling data used on the data blocks 24 of the memory device 18. In order to generate relevant data for any incumbent failure of the data blocks 24, FIG. 2 represents the data and wear-indicator blocks 24 and 26 as being subjected to P/E cycles ("writes"), and further represents accesses to the wear-indicator blocks 26 as being increased over the mean number of accesses to the data blocks 24, generally by some non-zero offset value. The wear-indicator blocks 26 are then tested using a standard "data integrity check" procedure of a type commonly performed by NAND controllers (such as the controller 20), such as comparison of checksums or signatures to generate test-ahead data. For example, the controller 20 can use an ECC mechanism to generate a checksum of a data range in the wear-indicator blocks 26 and compare the checksum to subsequent reads of checksums of the same data range. This data can then be monitored by the controller 20 to identify subsequent increases in bit error rates, and in particular unrecoverable bit error rates (UBER) that lead to data loss within the wear-indicator blocks 26. The offset value is preferably predetermined to constitute an adequate buffer so that bit error rates detected in a wear-indicator block 26 can be used to predict failures of the data blocks 24 before they occur during standard operation. The detection of an increase in the rate of bit errors, corresponding to fatigue of a wear-indicator block 26, allows appropriate corrective action to be taken with respect to the memory device 18, for example, the generation of a warning of a potential drive failure, and/or other appropriate action, including but not limited to the initiation of media scrubbing and/or a data back-up procedure. However, a corrective action may not be necessary if the bit error rate does not correspond to an increased number of P/E cycles, for example, due to read disturbs or the erratic nature of P/E errors.

Unlike hard disk drives (HDDs), the endurance and data retention of the NAND flash memory devices 18 will be influenced by the data pattern written to the array 16. Hard disk drives generally do not care whether a bit is "0" or "1." However, in the case of NAND flash technology, the "polarity" of data is an important factor since 1 is the fully erased state and 0 is the fully programmed state. The erased state does not lose data because of stress-induced leakage current or write/read disturbance. Likewise, if a block is erased, the effect of quantum mechanical tunneling on the oxide layer of cells being already at a "1" level is rather small. On the other hand, cells that are fully programmed (at a "0" level) need to unload the entire electron charge of the floating gate through the oxide layer, which causes the known breaking of atomic bonds within the tunnel oxide proper and at its layer interface. Moreover, programmed cells can lose data over time due to leakage current, which is exacerbated in the case of proximity effects such as the erasure of nearby blocks, causing accelerated loss of data through stress-induced leakage current (SILC).

Particularly in the case of rich media and office software applications, clusters of 0-bits are common, for example in the dark background of still images or movies, and in spaces between characters. In turn, this means that large portions of the workload will constitute a worst case scenario, which can cause accelerated fatigue of individual blocks even if wear leveling is optimally implemented. Therefore, an additional aspect of the invention is to apply a test payload in the form of a predefined pattern that is biased towards a worst case scenario by preferentially writing 0 bit values to the wear-indicator blocks 26. Alternatively, the test payload may by applied in the form of a predefined composite pattern, for example, the controller 20 may preferentially write 0 bit values to one set of wear-indicator blocks 26, write mixed 0 and 1 values to a second set of wear-indicator blocks 26, and preferentially write 1 bit values to a third set of wear-indicator blocks 26. The resulting fatigue-indicator data can then be used individually for the generation of first, second and third-level warnings. Alternatively, such a composite pattern can be rotated over the wear-indicator blocks 26 to simulate a more real usage-related wear indication.

In all instances, in order to anticipate the break point of the SSD 10, the wear-indicator blocks 26 need to be subjected to a higher number of P/E cycles than the number of P/E cycles encountered by the data blocks 24 of the SSD 10. The data patterns used to generate a higher number of P/E cycles to which the wear-indicator blocks 26 are subjected may also be based on random data samples of the P/E cycles encountered by the data blocks 24 of the SSD 10. In either case, the P/E cycles to which the wear-indicator blocks 26 are subjected may be a multiple of the sampled or average number of P/E cycles to the data blocks 24 of the SSD 10. As a nonlimiting example, a 10% offset can be chosen, irrespective of the absolute number of cycles. In this case, the "test ahead" is independent of the architectural and process idiosyncrasies of the integrated circuits (ICs) used as the memory devices 18, that is, it does not matter whether the device 18 has a typical write endurance of 3000 P/E cycles or 100,000 P/E cycles, the wear rate of the wear-indicator blocks 26 will always presumably be approximately 10% ahead of the data blocks 24.

In addition to or as an alternative to the above, the wear-indicator blocks 26 may be subjected to P/E cycles at some predetermined factory default, such that the wear-indicator blocks 26 of an otherwise new SSD 10 are artificially aged prior to using the SSD 10, for example, using the data blocks 24 for data storage.

According to another aspect of the invention, a specific subset of pages of one or more blocks 24 and/or 26 can be used to indicate fatigue, instead of an entire wear-indicator block 26 (and, therefore, all of its pages). For example, one or more of the 128 pages of every memory block (24 and 26) of the memory device 18 could be reserved as a wear-indicator page and programmed to the worst case scenario (0 bit value) every time the block is rewritten. Using a fixed page number, for example page 0 or 127, could be advantageous because it will not interrupt streaming data from consecutive pages, or may simplify the overall management of the test set due to lack of variability of addresses.

Figure 3:
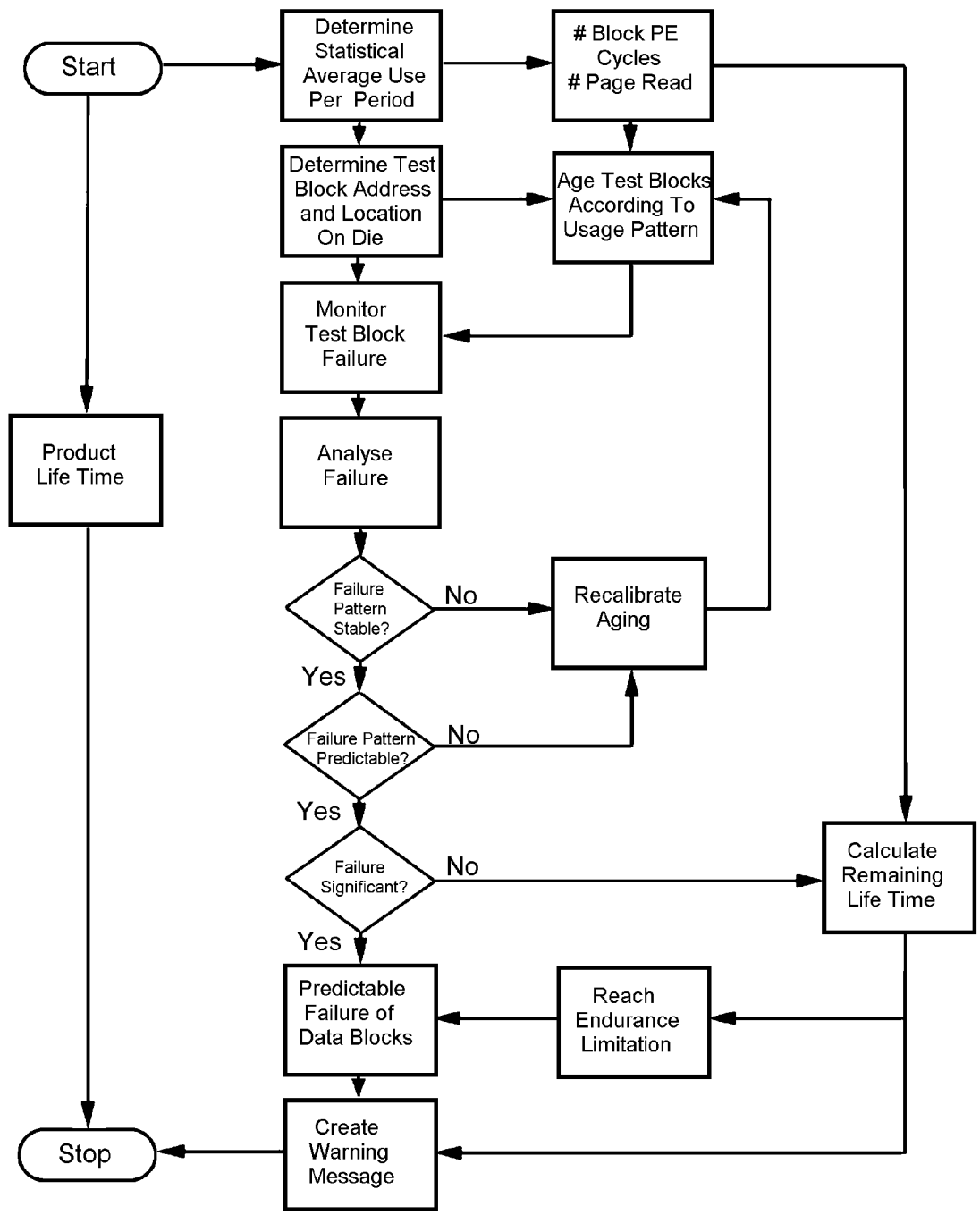
FIG. 3 is a more complex flow chart that represents the inclusion of recalibration of data and deterministic measures for anticipating device failure according to a preferred aspect of the invention.

FIG. 3 represents a flow chart in which some of the above-noted optional aspects of the invention are incorporated, for example, "aging" the wear-indicator ("test") blocks 26 by subjecting them to a number of P/E cycles that is a multiple of the average number of P/E cycles to the data blocks 24 of the SSD 10. FIG. 3 further represents the implementation of a relatively more complex process by which recalibration of data and deterministic measures are included for anticipating memory device breakdown. For example, occurrence of failure at the same address, that is, a "predictable" failure pattern and, by extension, an increase of the address range at which failures occur could be used as an indicator of mechanical wear tied to a specific bit line or word line. Similarities in such patterns over several wear-indicator blocks 26 could then be used as deterministic criteria to capture additional environmental and usage parameters to indicate accelerated fatigue. Alternatively, this kind of failure could be interpreted as a manufacturing flaw that has no bearing on the viability and reliability of the rest of the array. Depending on the specific patterns of failure, additional parameters can be developed to increase the level of warning or else discard the warning as production flaw and consequently retire the block 26 altogether as a bad block while substituting a spare data block 24 as a "new" wear-indicator block 26. Based on empirical data, the failure patterns of wear-indicator blocks 26 can also be used to anticipate the remaining life of the data blocks 24 and, instead of immediately retiring the SSD 10, issue a warning that the SSD 10 has reached an approximate percentage of its anticipated life and that failure will be likely after a predicted remaining life, which may be calculated based on the usage pattern of the SSD 10.

NAND flash bit errors have a tendency to occur spontaneously without recurrence in the subsequent P/E cycles. Therefore, another parameter taken into account in FIG. 3 is whether error rates are "stable" or whether a random peak occurs that is "significant" or otherwise has no real bearing as an indicator for the remaining life span of the NAND flash cells. To address this, error rates or error patterns can also be analyzed over consecutive accesses. For example, a sudden increase may show up during one access but the next access may show a reduced error rate. In this case, the increased error rate of the access during which it occurred is preferably ignored. A relatively easy approach to this is to average a number of consecutive accesses on the wear-indicator blocks 26. In that case, a single spike in error rates would show an increase in the averaged error rate, but after the particular access at which the spike occurred, the error rate would be stable over the entire range including the spike and subsequently again decrease to a lower value.

While the invention has been described in terms of particular embodiments, it is apparent that other forms could be adopted by one skilled in the art. Furthermore, though certain components are shown and preferred for the modified bad-block management of this invention to allow test-ahead in a NAND flash-based memory device, it is foreseeable that functionally-equivalent components could be used or subsequently developed to perform the intended functions of the disclosed components. Therefore, the scope of the invention is to be limited only by the following claims.

The invention claimed is:

1. A solid-state mass storage device comprising:
   a controller;
   at least one nonvolatile memory device comprising pages that are organized into memory blocks, at least a first memory block of the memory blocks being assigned as wear indicator means that is excluded from use as data storage for the nonvolatile memory device, and a plurality of the memory blocks being used as data blocks for data storage whereby data are written to and erased from each of the data blocks in program/erase (P/E) cycles;
   means for performing wear leveling to maintain substantially the same level of usage across the data blocks;
   means for subjecting the wear indicator means to P/E cycles so that the wear indicator means is subjected to a number of P/E cycles that is greater than the number of P/E cycles encountered by the data blocks;
   means for performing integrity checks of the wear indicator means and monitoring a bit error rate thereof; and
   means for analyzing failure patterns over consecutive P/E cycles of the wear indicator means.

2. The solid-state mass storage device of claim 1, wherein the wear indicator means comprises a plurality but not all of the pages of at least some of the memory blocks of the nonvolatile memory device.

3. The solid-state mass storage device of claim 1, wherein the wear indicator means comprises all of the pages of at least the first memory block of the nonvolatile memory device.

4. The solid-state mass storage device of claim 1, wherein the wear indicator means comprises all of the pages of only the first memory block of the nonvolatile memory device.

5. The solid state mass storage device of claim 1, wherein the analyzing means identifies whether the failure patterns are recurrent during the consecutive P/E cycles.

6. The solid state mass storage device of claim 5, wherein the analyzing means averages error rates occurring in the wear indicator means over the consecutive P/E cycles to establish a trend.

7. The solid state mass storage device of claim 6, wherein the analyzing means triggers a corrective action if consecutive increases occur in consecutive averaged error rates in the wear indicator means.

\* \* \* \* \*